(12) United States Patent
Wu et al.

(10) Patent No.: US 7,595,999 B2
(45) Date of Patent: Sep. 29, 2009

(54) SYSTEM AND METHOD FOR COUPLING AN INTEGRATED CIRCUIT TO A CIRCUIT BOARD

(75) Inventors: Chen-Fa Wu, Tao-Yuan (TW);
Chih-Nan Lin, Zhu Bei (TW);
Kuo-Ching Huang, Taipei (TW);
Chin-An Huang, Xindian (TW)

(73) Assignee: Dell Products L.P., Round Rock, TX (US)

( * ) Notice: Subject to any disclaimer, the term of this patent is extended or adjusted under 35 U.S.C. 154(b) by 217 days.

(21) Appl. No.: 11/766,204

(22) Filed: Jun. 21, 2007

(65) Prior Publication Data

US 2008/0318454 A1 Dec. 25, 2008

(51) Int. Cl.
*H05K 7/06* (2006.01)
(52) U.S. Cl. .................................. 361/760
(58) Field of Classification Search ............ 439/55; 174/255, 269; 361/768, 774, 777, 760
See application file for complete search history.

(56) References Cited

U.S. PATENT DOCUMENTS

| | | | | |
|---|---|---|---|---|
| 3,777,220 A * | 12/1973 | Tatusko et al. | ............... | 361/777 |
| 4,086,426 A * | 4/1978 | Knappenberger | ............ | 174/261 |
| 4,399,484 A * | 8/1983 | Mayer | ......................... | 361/689 |
| 4,641,222 A * | 2/1987 | Derfiny et al. | ............... | 361/768 |
| 4,658,331 A | 4/1987 | Berg | ............................ | 361/387 |
| H000921 H * | 5/1991 | Wannemacher, Jr. | ........ | 361/767 |
| 5,121,290 A * | 6/1992 | Azar | ............................ | 361/692 |
| 5,166,865 A * | 11/1992 | Morrison et al. | ............. | 361/760 |
| 5,386,343 A * | 1/1995 | Pao | .............................. | 361/761 |
| 5,600,884 A * | 2/1997 | Kondo et al. | ................... | 29/852 |
| 5,699,231 A * | 12/1997 | ElHatem et al. | .............. | 361/752 |
| 6,064,576 A * | 5/2000 | Edwards et al. | .............. | 361/776 |
| 6,084,782 A * | 7/2000 | Huynh et al. | ................. | 361/777 |
| 6,233,816 B1 * | 5/2001 | Franke et al. | .................. | 29/829 |
| 6,235,994 B1 * | 5/2001 | Chamberlin et al. | ........ | 174/252 |
| 6,252,298 B1 | 6/2001 | Lee et al. | ..................... | 257/668 |
| 6,498,708 B2 * | 12/2002 | Schilloff et al. | ............... | 361/58 |
| 6,693,349 B2 * | 2/2004 | Akram | ........................ | 257/696 |
| 7,139,177 B2 * | 11/2006 | Gottlieb | ....................... | 361/788 |
| 7,557,303 B2 * | 7/2009 | Tang | ............................ | 174/255 |
| 2003/0087546 A1 * | 5/2003 | Hellriegel et al. | ............ | 439/457 |
| 2008/0142250 A1 * | 6/2008 | Tang | ............................ | 174/255 |

* cited by examiner

*Primary Examiner*—Neil Abrams
(74) *Attorney, Agent, or Firm*—Hamilton & Terrile, LLP; Robert W. Holland

(57) ABSTRACT

An information handling system circuit board has an opening formed through it proximate a coupling point of an integrated circuit to the circuit board. The opening manages stress at the coupling point of the integrated circuit to the circuit board to reduce the risk of damage to the coupling point during deformation of the circuit board, such as when the circuit board is coupled to a chassis or when a component is pressed into the circuit board. In one embodiment, rectangular openings are formed at diagonally opposed corners of a BSA integrated circuit. In alternative embodiments, openings of varying shape, such as slots or curved slots, are formed at selected corners of the integrated circuit.

13 Claims, 9 Drawing Sheets

SYSTEM AND METHOD FOR COUPLING AN INTEGRATED CIRCUIT TO A CIRCUIT BOARD

BACKGROUND OF THE INVENTION

1. Field of the Invention

The present invention relates in general to information handling system circuit boards, and more particularly to a system and method for coupling an integrated circuit to a circuit board.

2. Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Typically, information handling systems interface a variety of components with each other through a common circuit board, such as a printed circuit board (PCB). The circuit board used to support the primary processing components of an information handling system, such as the central processing unit (CPU), is typically referred to as a motherboard. Traces running through the motherboard support rapid communication of electrical signals between pins of the CPU and pins of other components, such as the random access memory (RAM), a chipset, and slots designed to accept daughter board cards. Generally, daughter boards are cards made of a circuit board and components that perform specialized functions, such as graphics processing or network communications. In the past, processing components generally coupled to a motherboard with a socket and pin arrangement. For example, pins extending outward from the outer periphery of an integrated circuit inserted into a socket securely fastened to the motherboard and interfaced with traces running through the motherboard. More recently, in an effort to make better use of motherboard space and increase the rate at which information is communicated, the pins of the integrated circuit terminate across the lower surface of the integrated circuit. The pins couple to the motherboard traces through a series of contacts across the bottom surface of the integrated circuit, such as opposing balls of electrically conductive material. One example of such an arrangement is a ball grid array (BGA) integrated circuit which couples to a pin grid array (PGA) socket.

Although BGA chips provide improved communication speeds at the motherboard or daughter board traces, the coupling of the integrated circuit to the underlying circuit board material tends to be less secure than conventional pin coupling. For example, circuit boards made of thin plastic material tend to flex when components are pressed into place, such as when daughter boards are pressed into motherboard slots. As another example, circuit boards tend to flex when secured to an information handling system chassis, such as by tightening a screw through a hole made in the board and into a chassis coupling point. As the circuit board flexes, the integrated circuit is stressed relative to the circuit board surface. If the stress between the integrated circuit and circuit board becomes excessive, coupling material that couples the integrated circuit to the circuit board may crack or break. For example, solder ball coupling points located at the corners of the integrated circuit may crack or break so that communication between the integrated circuit and circuit board are compromised, leading to failure of the information handling system. One approach for addressing this difficulty is to add glue at the corner of the integrated circuit to increase the binding force between the integrated circuit and the circuit board. However, glue typically has poor thermal characteristics which often lead to failure. Another approach is to limit circuit board deformation when under pressure, such as by adding rubber under the circuit board. However, this increases the cost and weight of the system.

SUMMARY OF THE INVENTION

Therefore, a need has arisen for a system and method which couples an integrated circuit to a circuit board with reduced stress at the integrated circuit during deformation of the circuit board.

In accordance with the present invention, a system and method are provided which substantially reduce the disadvantages and problems associated with previous methods and systems for coupling an integrated circuit to a circuit board. Openings formed in the circuit board proximate the integrated circuit to manage stress at coupling points of the integrated circuit to the circuit board so that the risk of damage to coupling points is reduced.

More specifically, an information handling system has a motherboard coupled to a chassis. The motherboard accepts coupling of components at its upper surface and provides wire lines for communication between the components. One component coupled to the motherboard is a BGA integrated circuit having a rectangular shape with four corners. Openings are formed in the motherboard proximate the BGA integrated circuit, such as at diagonally opposed corners. The openings manage stress generated by deformation of the motherboard so that coupling points that couple the BGA integrated circuit to the motherboard have a reduced risk of breaking, cracking or other damage. For example, stress at BGA integrated circuit coupling points is reduced by placement of the openings during deformation of the motherboard due to coupling of the motherboard to a chassis or due to insertion of daughter board cards into motherboard slots. In one embodiment, the openings have a triangular shape. In an alternative embodiment, the openings have a slot shape.

The present invention provides a number of important technical advantages. One example of an important technical advantage is that stresses placed upon the integrated circuit are reduced during deformation of the circuit board. Thus, the risk of damage to the coupling point of the integrated circuit and circuit board is reduced during attachment of the circuit board to an information handling system chassis and during insertion of daughter boards into motherboard slots. Circuit board deformation is managed by selectively placed, shaped and sized holes through the circuit board proximate the integrated circuit coupling point. An advantage of this approach to managing circuit board deformation is that the strength of the circuit board material need not be increased to reduce deformation so that the circuit board does not increase in weight or cost.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

Stress management openings selectively disposed in an information handling system circuit board distributes strain caused by deformation of the circuit board to reduce the risk of damage to an integrated circuit coupled to the circuit board. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
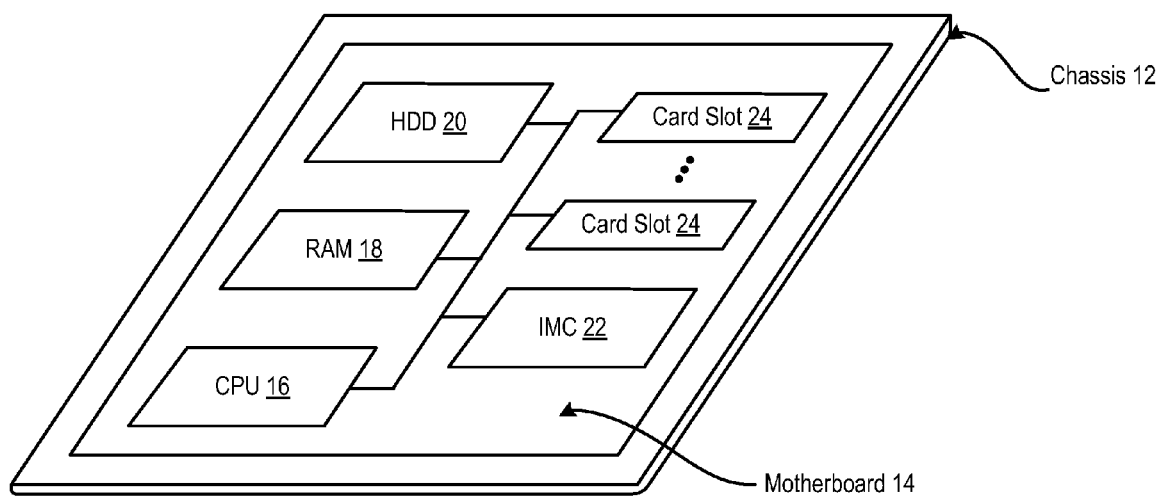
FIG. 1 depicts a block diagram of an information handling system server.

Referring now to FIG. 1, a block diagram depicts an information handling system server 10 as one example of use of a circuit board in an information handling system. Information handling system 10 is built in a chassis 12. A motherboard 14 couples to chassis 12 to support a variety of components that cooperate to process information. For example, a CPU 16, RAM 18, hard disk drive 20 and IMC 22 cooperate to provide network communications at information handling system server 10. In other types of information handling systems, firmware support, such as a BIOS, is provided by other types of processing components, such as a chipset. Card slots 24 coupled to motherboard 14 allow selective addition or removal of desired functionality by the insertion or removal of cards into slots 24, such as graphics cards to provide graphics functionality or PCI Express cards to provide communication for peripheral devices.

Figure 2A:
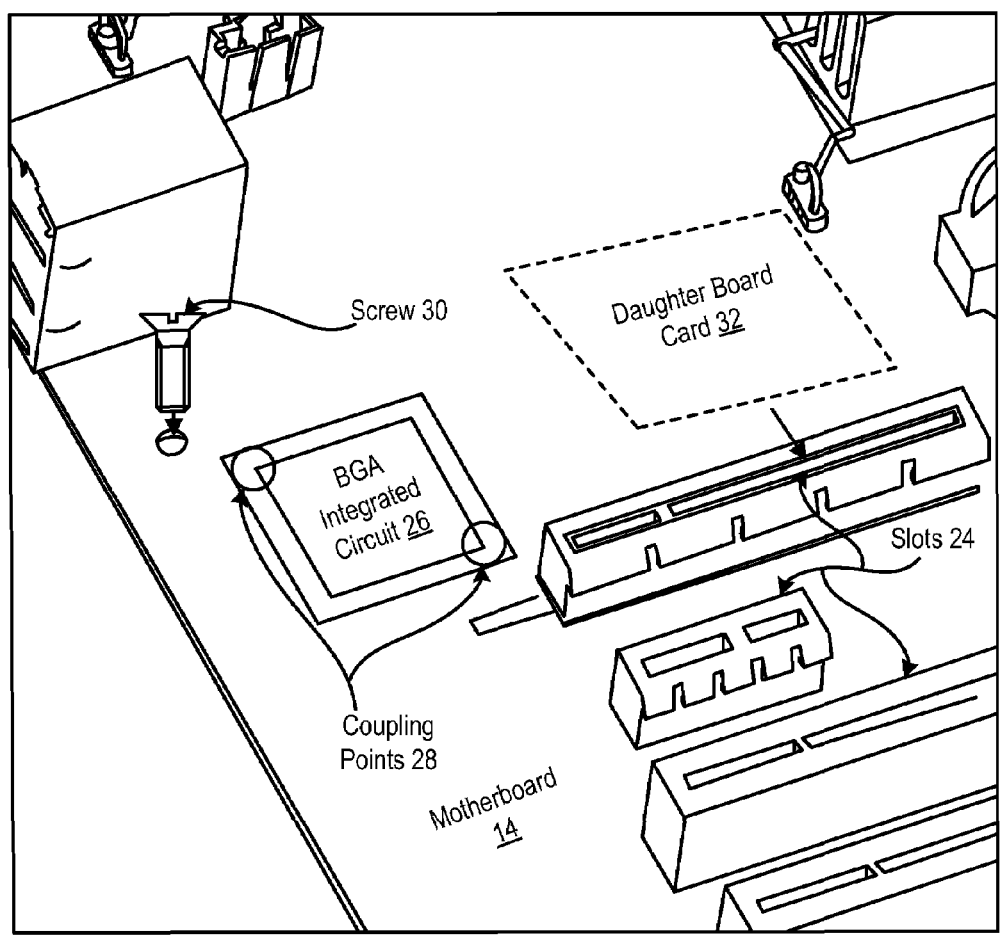
FIG. 2A depicts an upper side view of a circuit board having components coupled to an upper surface.
Figure 2B:
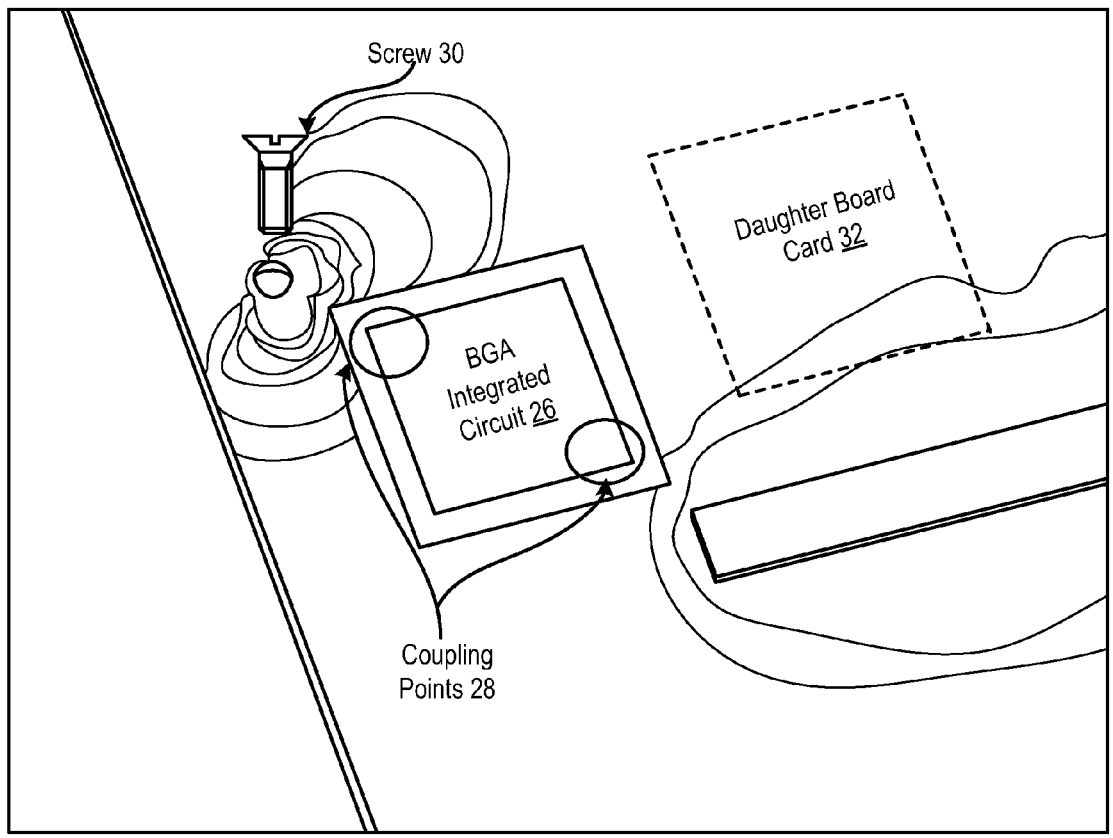
FIG. 2B depicts a simulated strain distribution of the circuit board of FIG. 2A from deformation caused by force applied to the circuit board.
Figure 2C:
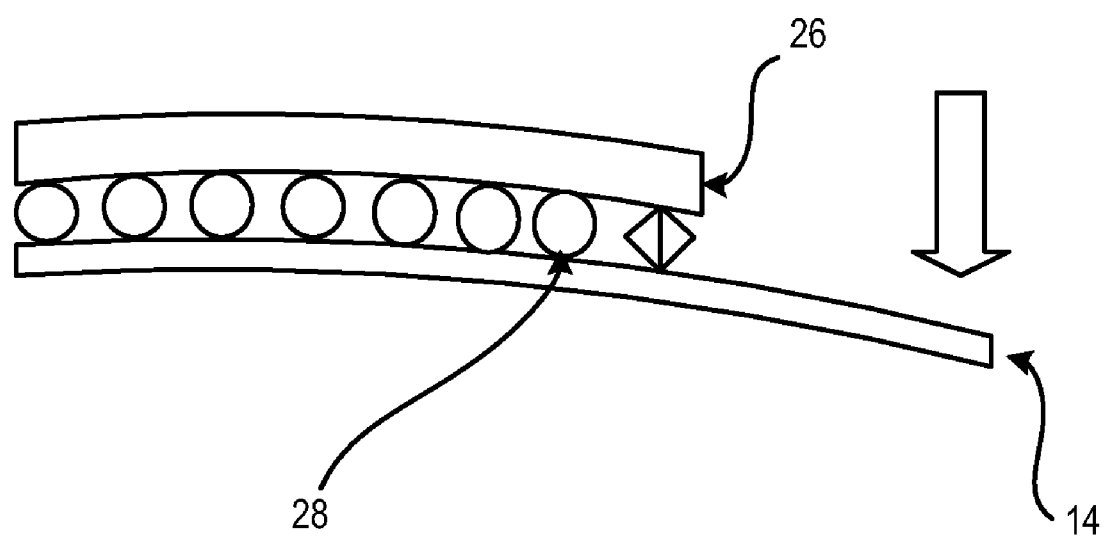
FIG. 2C depicts a side cutaway view of strain applied at a BGA integrated circuit coupling point due to circuit board deformation.

Referring now to FIGS. 2A and 2B, an upper side view depicts a circuit board 14 having components coupled to an upper surface and a simulated strain distribution of the circuit board from deformation caused by force applied to the circuit board. A BGA integrated circuit 26 couples to circuit board 14 at two or more coupling points 28, such as coupling points E and F. BGA integrated circuit 26 may provide a variety of functions, such as CPU functions, graphics functions, chipset functions, etc . . . Forces pressing against circuit board 14 that cause deformation of circuit board 14 include a screw 30 used to couple circuit board 14 to a chassis and a daughter board card 32 inserted into a slot 24. As depicted by FIG. 2B, strain from the deformation of circuit board 14 radiates in various concentrations across circuit board 14 with increase stress placed at coupling points E and F. The concentration of stress at points E and F can crack or break material associated with the coupling points, such as solder balls. For example, FIG. 2C depicts a side cutaway view of strain applied at a BGA integrated circuit coupling point due to circuit board deformation. Coupling points 28 are solder balls coupled to a PGA socket with the outer solder balls bearing a concentration of stress from the deformation of the circuit board.

Figure 3A:
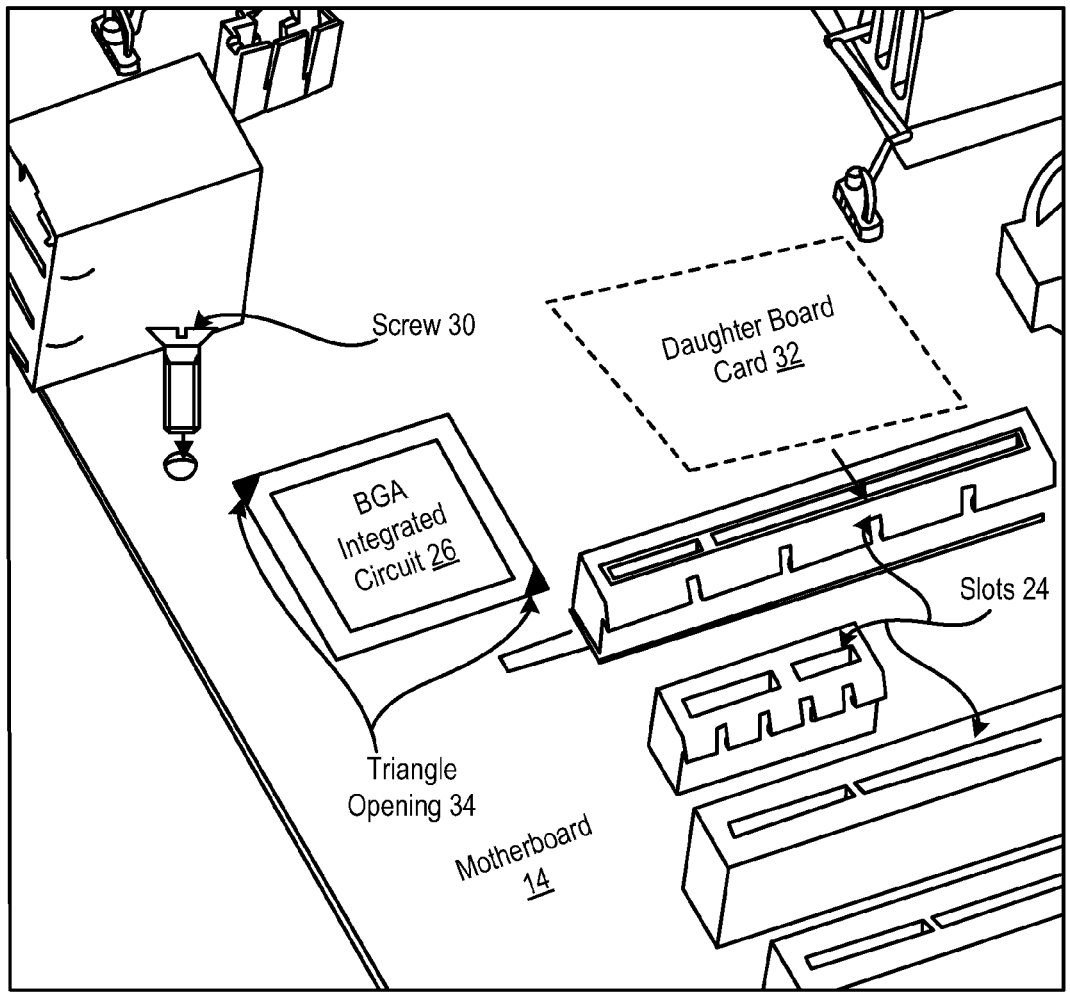
FIG. 3A depicts an upper side view of a circuit board having components coupled to an upper surface and triangular stress management openings.
Figure 3B:
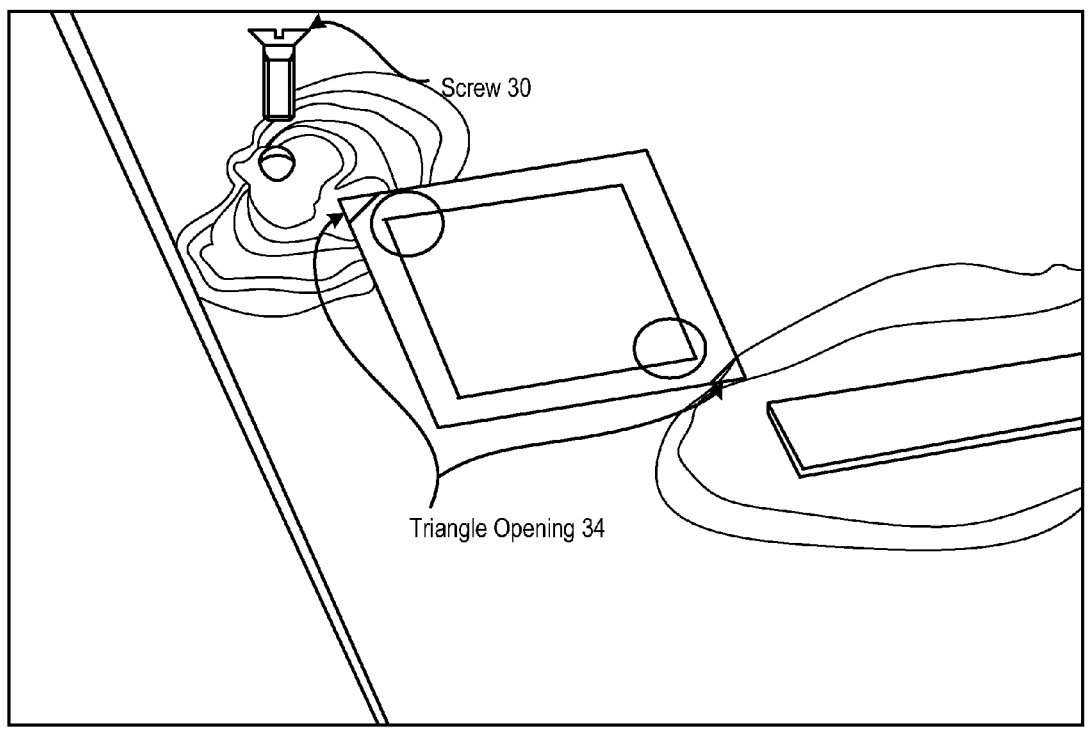
FIG. 3B depicts a simulated strain distribution of the circuit board of FIG. 3A from deformation caused by force applied to the circuit board.

Referring now to FIGS. 3A and 3B, an upper side view depicts a circuit board having components coupled to an upper surface with triangular stress management openings 34 and a simulated strain distribution of the circuit board from deformation caused by force applied to the circuit board. BGA integrated circuit couples to circuit board 14 at coupling points 28, such as coupling points E and F. Triangular openings 34 are formed in circuit board 14 proximate coupling points E and F. The size, location and orientation of triangular openings 34 may be determined experimentally to manage strain distribution across circuit board 14 during deformations, such as coupling circuit board 14 to a chassis with screw 30 or inserting a card 32 into a slot 24. In the depicted embodiment, triangular openings 34 are disposed in circuit board 14 at diagonally opposed corners of BGA integrated circuit 26. As depicted by FIG. 3B, strain from the deformation of circuit board 14 radiates in various concentrations across circuit board 14 with stress placed at coupling points E and F reduced relative to the stress depicted by FIG. 2B where no stress management openings 34 are included. Although the concentration of stress at points E and F can crack or break material associated with the coupling points, such as solder balls, that stress is reduced in the proximity of stress management openings 34, thus reducing the risk of damage at coupling points E and F.

Figure 4A:
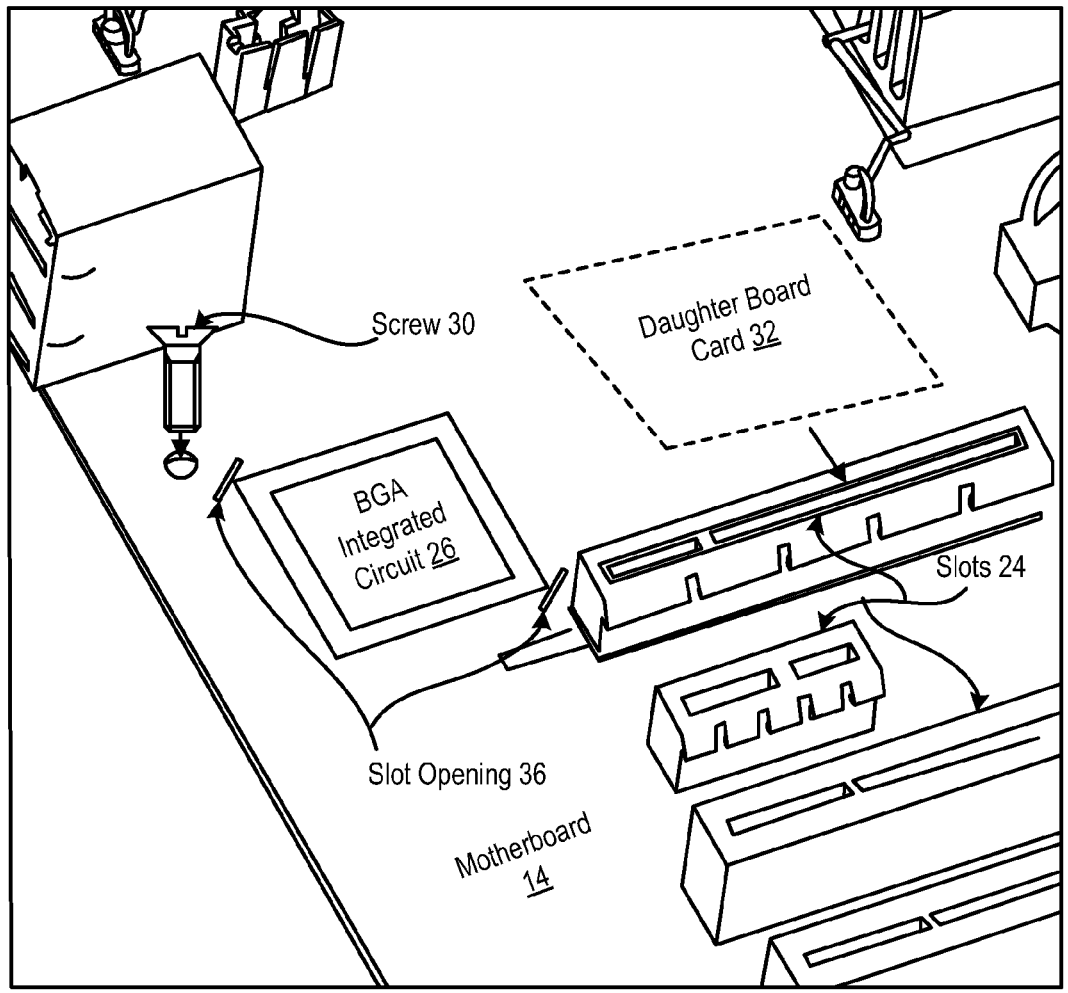
FIG. 4A depicts an upper side view of a circuit board having components coupled to an upper surface and slot stress management openings.
Figure 4B:
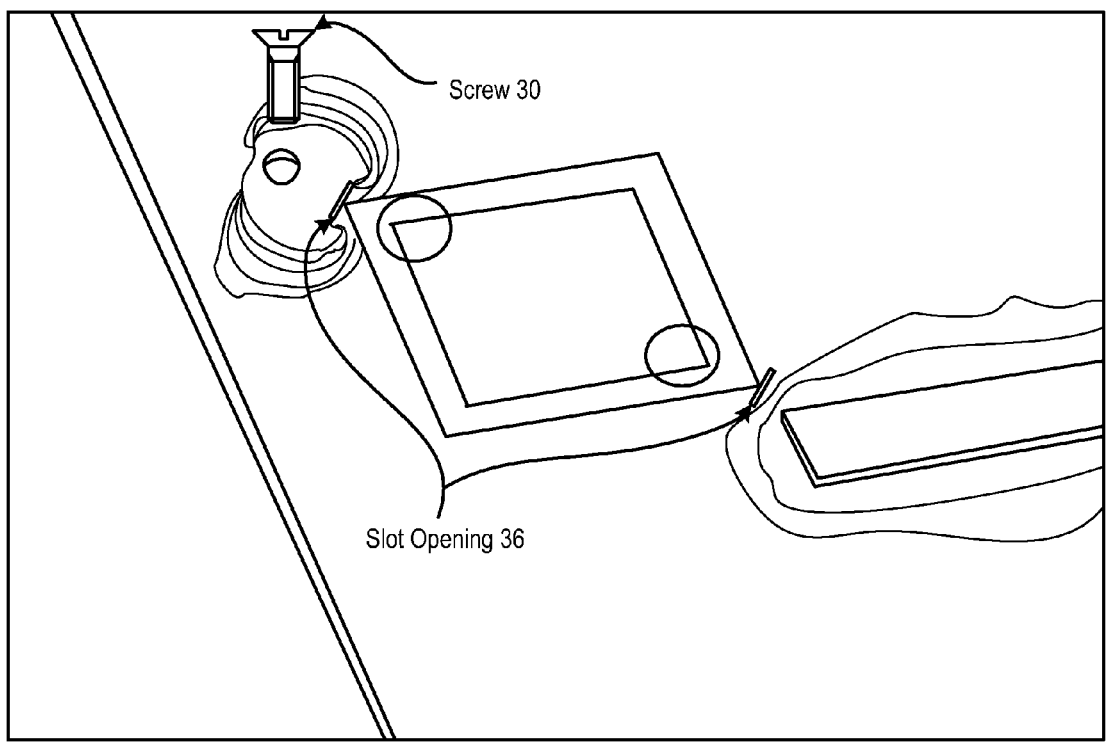
FIG. 4B depicts a simulated strain distribution of the circuit board of FIG. 4A from deformation caused by force applied to the circuit board.

Referring now to FIGS. 4A and 4B, an upper side view depicts a circuit board 14 having components coupled to an upper surface with slot stress management openings and a simulated strain distribution of the circuit board from deformation caused by force applied to the circuit board. BGA integrated circuit couples to circuit board 14 at coupling points 28, such as coupling points E and F. Slot openings 36 are formed in circuit board 14 proximate coupling points E and F. The size, location and orientation of slot openings 36 may be determined experimentally to manage strain distribution across circuit board 14 during deformations, such as coupling circuit board 14 to a chassis with screw 30 or inserting a card 32 into a slot 24. In the depicted embodiment, slot openings 36 are disposed in circuit board 14 at diagonally opposed corners of BGA integrated circuit 26. As depicted by FIG. 4B, strain from the deformation of circuit board 14 radiates in various concentrations across circuit board 14 with stress placed at coupling points E and F reduced relative to the stress depicted by FIG. 2B where no stress management openings 36 are included. Although the concentration of stress at points E and F can crack or break material associated with the coupling points, such as solder balls, that stress is reduced in the proximity of stress management openings 36, thus reducing the risk of damage at coupling points E and F. Note that in alternative embodiments, the opening may be formed in varying shapes and at varying locations to manage various kinds of stress. For example, analysis of stress at the integrated circuit may indicate that curving the slot will provide improved stress management. Further, the corners where the openings are formed may vary according to the location at which stress is anticipated. For example, stress at two corners of an integrated circuit that share a side of its rectangular shape may indicate that the openings be formed to share a common side of the integrated circuit, such as the two corners of the same side of the rectangular shape.

Figure 5:
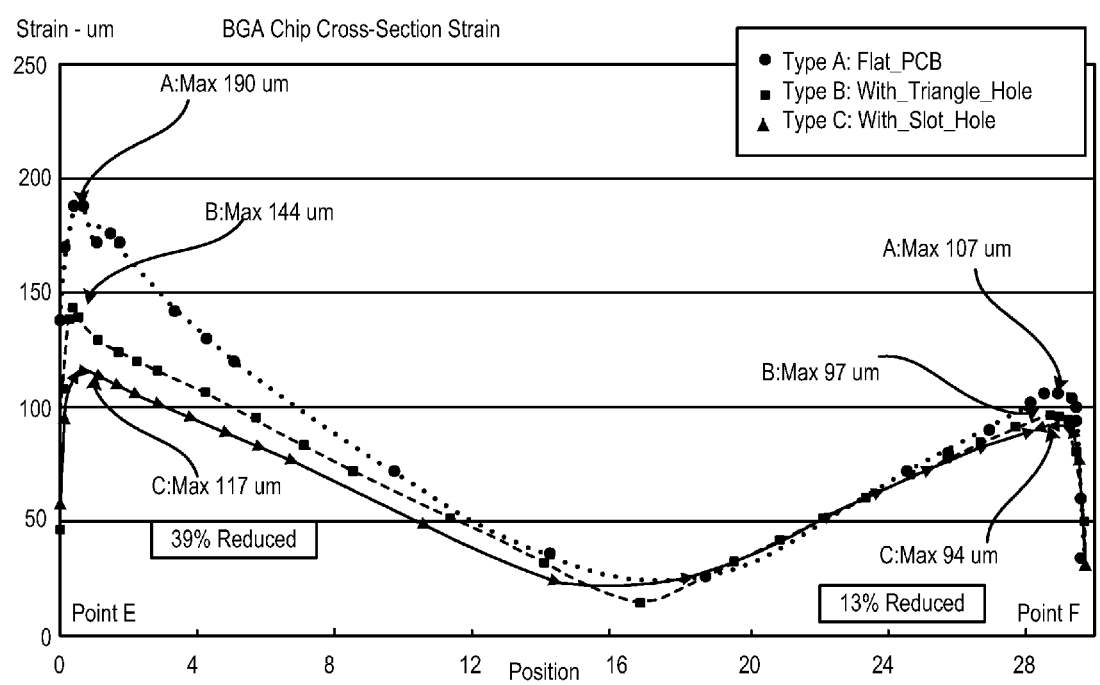
FIG. 5 depicts a graphical comparison of strain distribution for a circuit board having no stress management openings, a circuit board having triangular stress management openings, and a circuit board having slot stress management openings.

Referring now to FIG. 5 a graphical comparison depicts strain distribution for a circuit board having no stress management openings, a circuit board having triangular stress management openings, and a circuit board having slot stress management openings. Simulate strain distribution shows that stress at coupling point E is reduced by 39% when triangular stress management opening 34 are formed in circuit board 14 proximate coupling point E when compared with a circuit board having no stress management openings. Substantial reduction in stress is also obtained at point E with slot stress management openings. At point F, a 13% reduction in stress is achieved with a circuit board having triangular stress management openings compared with a circuit board having no stress management openings. Similar results are available at point F with a slot stress management opening. In other embodiments, various combinations of different types of stress management openings may be formed in circuit board 14 to achieve desired strain distribution relative to an integrated circuit, such as a BGA integrated circuit, for circuits having varying deformation characteristics.

Although the present invention has been described in detail, it should be understood that various changes, substitutions and alterations can be made hereto without departing from the spirit and scope of the invention as defined by the appended claims.

What is claimed is:

1. An information handling system comprising:
   a processor operable to process information; and
   a circuit board operable to accept the processor at one or more coupling points, the circuit board having one or more traces to communicate the information, the circuit board having at least one triangle-shaped opening formed proximate at least one coupling point, the triangle-shaped opening positioned to reduce stress at the coupling point during deformation of the circuit board.

2. The information handling system of claim 1 wherein the processor comprises a BGA integrated circuit.

3. The information handling system of claim 1 wherein the circuit board comprises a motherboard.

4. The information handling system of claim 1 wherein deformation of the circuit board comprises coupling of the circuit board to a chassis.

5. The information handling system of claim 1 wherein deformation of the circuit board comprises coupling of a component to the circuit board.

6. The information handling system of claim 1 wherein the integrated circuit comprises a rectangle having four corners and wherein the opening formed proximate the coupling point comprises a triangle proximate a corner of the integrated circuit.

7. The information handling system of claim 6 wherein the rectangle comprises a square and the opening formed proximate the coupling point comprises first and second triangle openings, the first triangle opening proximate a first corner, the second triangle opening proximate a second corner diagonally opposed to the first corner.

8. A method for coupling an integrated circuit to a circuit board, the method comprising:
   coupling the integrated circuit to the circuit board at plural coupling points; and
   forming at least one triangle opening through the circuit board proximate at least one coupling point, the triangle opening positioned to reduce stress at the coupling point during deformation of the circuit board.

9. The method of claim 8 further comprising:
   deforming the circuit board; and
   managing stress generated at the coupling point from the deforming with the opening.

10. The method of claim 9 wherein deforming the circuit board further comprises coupling the circuit board to an information handling system chassis.

11. The method of claim 9 wherein deforming the circuit board further comprises pressing a component into the circuit board.

12. The method of claim 8 wherein the integrated circuit comprises a BGA integrated circuit.

13. The method of claim 12 wherein the BGA integrated circuit comprises a rectangle having four corners and wherein forming at least one opening further comprises forming first and second triangles at diagonally opposed corners of the BGA integrated circuit.

* * * * *